(12) United States Patent
Nishimura

(10) Patent No.: US 11,462,404 B2
(45) Date of Patent: Oct. 4, 2022

(54) IMPRINT APPARATUS AND METHOD OF MANUFACTURING ARTICLE

(71) Applicant: CANON KABUSHIKI KAISHA, Tokyo (JP)

(72) Inventor: Naosuke Nishimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/388,965

(22) Filed: Apr. 19, 2019

(65) Prior Publication Data

US 2019/0333757 A1 Oct. 31, 2019

(30) Foreign Application Priority Data

Apr. 26, 2018 (JP) .............................. JP2018-085724

(51) Int. Cl.
*H01L 21/00* (2006.01)
*H01L 21/027* (2006.01)
*G03F 7/00* (2006.01)

(52) U.S. Cl.
CPC ........ *H01L 21/0274* (2013.01); *G03F 7/0002* (2013.01)

(58) Field of Classification Search
CPC .......................... H01L 21/0274; G03F 7/0002
See application file for complete search history.

(56) References Cited

U.S. PATENT DOCUMENTS

| | | | |
|---|---|---|---|
| 8,968,620 B2 | 3/2015 | Im et al. | |
| 9,568,819 B2* | 2/2017 | Torii ..................... | B82Y 10/00 |
| 2004/0149687 A1* | 8/2004 | Choi ...................... | B82Y 10/00 216/40 |
| 2005/0230346 A1* | 10/2005 | Kasumi .................. | B82Y 40/00 216/44 |
| 2007/0018358 A1* | 1/2007 | Heidari ................. | G03F 7/0002 264/334 |
| 2008/0213418 A1* | 9/2008 | Tan ....................... | G03F 7/0002 425/112 |
| 2010/0013169 A1* | 1/2010 | Monteen ............. | H01L 21/6838 279/3 |

(Continued)

FOREIGN PATENT DOCUMENTS

| | | |
|---|---|---|
| JP | H07288276 A | 10/1995 |
| JP | 2003051535 A | 2/2003 |

(Continued)

*Primary Examiner* — Nicholas R Krasnow
(74) *Attorney, Agent, or Firm* — Rossi, Kimms & McDowell LLP

(57) ABSTRACT

An imprint apparatus forms a pattern on a substrate by an imprint process which includes a process of bringing an imprint material on the substrate into contact with a mold, a process of curing the imprint material, and a separating process of separating a cured product of the imprint material and the mold. The apparatus includes a substrate holding mechanism which includes a substrate chuck configured to chuck the substrate by sucking the substrate. The substrate chuck has a through hole, and the substrate holding mechanism suppresses a state in which a suction force by which the substrate chuck sucks the substrate is reduced due to the through hole and a gap which is formed between a back surface of the substrate and an upper surface of the substrate chuck in the separating process.

17 Claims, 13 Drawing Sheets

(56) References Cited

U.S. PATENT DOCUMENTS

| | | | | |
|---|---|---|---|---|
| 2010/0018420 A1* | 1/2010 | Menard | ................ | G03F 7/0002 |
| | | | | 101/333 |
| 2010/0059904 A1* | 3/2010 | Kasumi | .................. | B29C 59/04 |
| | | | | 264/293 |
| 2010/0201042 A1* | 8/2010 | Sreenivasan | .......... | G03F 7/0002 |
| | | | | 264/494 |
| 2010/0260885 A1* | 10/2010 | Takahashi | ............... | B82Y 10/00 |
| | | | | 425/405.2 |
| 2011/0018158 A1* | 1/2011 | Menard | ............. | H01L 21/67092 |
| | | | | 264/101 |
| 2011/0018564 A1* | 1/2011 | Washio | .............. | G01R 31/2891 |
| | | | | 324/750.16 |
| 2014/0305904 A1* | 10/2014 | Lan | ....................... | G03F 7/0002 |
| | | | | 216/40 |
| 2014/0367887 A1* | 12/2014 | Sachs | ..................... | B29C 59/02 |
| | | | | 264/293 |
| 2016/0039126 A1* | 2/2016 | Tan | ......................... | B29C 43/58 |
| | | | | 264/40.5 |
| 2017/0219504 A1* | 8/2017 | Volz | ................... | H01L 21/6838 |
| 2018/0308737 A1* | 10/2018 | Moriya | ............. | H01L 21/68735 |

FOREIGN PATENT DOCUMENTS

| | | | |
|---|---|---|---|
| JP | 2015195409 A | 11/2015 | |
| JP | 2016101670 A | 6/2016 | |
| JP | 2017092396 A | 5/2017 | |
| JP | 2017175071 A | 9/2017 | |
| JP | 2018019064 A | 2/2018 | |
| KR | 1020100130113 A | 12/2010 | |

\* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus can form a pattern formed from a cured product of an imprint material on a substrate by performing a contact process of bringing a mold and the imprint material on the substrate into contact with each other, a curing process of curing the imprint material, and a separating process of separating the mold and the cured product of the imprint material. In the imprint apparatus, back pressure can be applied to the back surface of a substrate to control the shape of the substrate. In Japanese Patent Laid-Open No. 2015-195409, there is disclosed that a horizontal distortion between a template and a substrate and a horizontal distortion ratio thereof are controlled by controlling the template (mold) and the back pressure on the substrate.

Japanese Patent Laid-Open No. 7-288276 discloses that three pins will be used to receive a wafer from a conveyance arm and that the wafer will be subsequently placed on a wafer holder by driving the three pins or the wafer holder. The three pins are arranged so as to pass three corresponding through holes which are provided in the wafer holder.

In the separating process, since a portion of the substrate is pulled toward the side of the mold via the cured product of the imprint material, it can deform the substrate so that the portion of the substrate will separate from a substrate chuck. If the substrate chuck has a through hole, air can flow into the space between the substrate and the substrate chuck via the through hole when the substrate is deformed so that a portion of the substrate will separate from the substrate chuck. As a result, the shape of the substrate can deviate from the target shape. Such a phenomenon can cause an imprint defect (for example, a pattern transfer defect).

SUMMARY OF THE INVENTION

The present invention provides a technique advantageous in reducing the generation of an imprint defect (for example, a pattern transfer defect).

One of aspects of the present invention provides an imprint apparatus that forms a pattern on a substrate by an imprint process including a process of bringing an imprint material on the substrate into contact with a mold, a process of curing the imprint material, and a separating process of separating a cured product of the imprint material and the mold, the apparatus comprising: a substrate holding mechanism which includes a substrate chuck configured to chuck the substrate by sucking the substrate, wherein the substrate chuck has a through hole, and the substrate holding mechanism suppresses a state in which a suction force by which the substrate chuck sucks the substrate is reduced due to the through hole and a gap which is formed between a back surface of the substrate and an upper surface of the substrate chuck in the separating process.

Further features of the present invention will become apparent from the following description of exemplary embodiments with reference to the attached drawings.

DESCRIPTION OF THE EMBODIMENTS

Exemplary embodiments of the present invention will be described hereinafter with reference to the accompanying drawings.

Figure 1:
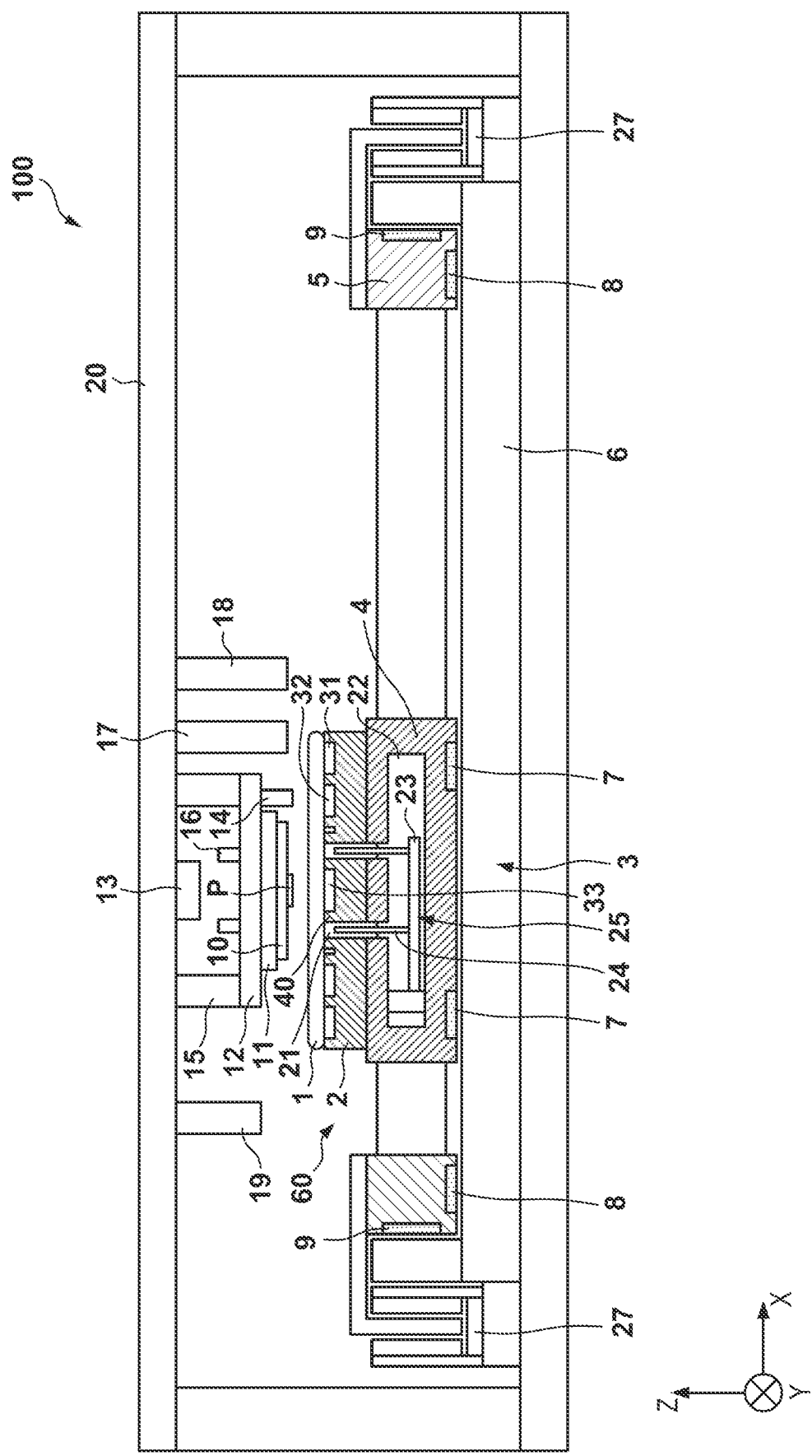
FIG. 1 is a view showing the arrangement of an imprint apparatus according to the first embodiment of the present invention.

FIG. 1 shows the arrangement of an imprint apparatus 100 according to the first embodiment of the present invention. The imprint apparatus 100 performs an imprint process by using a mold 10 to form a pattern made of a cured product of an imprint material on a substrate 1. As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photocurable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated by an XYZ coordinate system in which directions parallel to the surface of the substrate 1 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment can include control of the position and/or orientation of at least one of the substrate and the mold.

The substrate 1 is positioned by a substrate drive mechanism 3. The substrate 1 is held by a substrate holding mechanism 60. The substrate holding mechanism 60 includes a substrate chuck 2. The substrate 1 is arranged on the substrate chuck 2 and is chucked (held) by the substrate chuck 2. The substrate drive mechanism 3 can include an XY movable part 4 that holds the substrate chuck 2, a Y movable part 5 that moves the XY movable part 4 in the Y direction, and a stage plate 6 that supports the XY movable part 4 and the Y movable part 5. The substrate chuck 2 can be mounted on the upper surface of the XY movable part 4. The XY movable part 4 is kept in a floating state above the surface of the stage plate 6 as a guide surface by air guides 7 arranged at the bottom of the XY movable part 4. In addition, the XY movable part 4 can be driven in the X direction by an X linear motor (not shown) while being guided by the Y movable part 5. A mover of the X linear motor can be arranged in the XY movable part 4, and a stator of the X linear motor can be arranged in the Y movable part 5. The Y movable part 5 is guided by the stage plate 6 via air guides 8 and 9 and can be driven in the Y direction by the Y linear motor 27. The imprint apparatus 100 can include a position sensor (not shown) that measures X-axis direction and Y-axis direction positions of the XY movable part 4 or the substrate chuck 2.

The mold 10 can include a pattern portion P that has, on its surface, a pattern (concave-convex pattern) to be transferred to the substrate 1 (imprint material). The pattern portion P can be arranged in, for example, a mesa portion of the mold 10. The mesa portion is a portion that protrudes (downward in FIG. 1) more than its periphery. The mold 10 is chucked (held) by a mold chuck 11. The mold chuck 11 can be mounted on a mold stage 12. The mold stage 12 can be driven by a mold drive mechanism 15. The mold drive mechanism 15 can have, for example, a function that drives the mold stage 12 in the Z direction to press the mold 10 held by the mold chuck 11 onto the imprint material on the substrate 1 and to separate the mold 10 from the cured product of the imprint material on the substrate 1. The mold drive mechanism 15 can further have a function that corrects the tilt of the mold 10 in accordance with the surface of the substrate 1. The mold stage 12 can be supported by, for example, a support plate 20 via the mold drive mechanism 15.

The imprint apparatus 100 includes a curing device 13 that cures the imprint material by irradiating the imprint material with a curing energy (for example, light such as ultraviolet light) via the mold 10 in a state in which the imprint material on the substrate 1 and (the pattern portion P of) the mold 10 are in contact with each other. Each of the mold chuck 11 and the mold stage 12 can have an opening (not shown) which allows the curing energy from the curing device 13 to pass through. A load cell for detecting the pressing force when the mold 10 is pressed against the imprint material on the substrate 1 can be embedded in the mold stage 12. A gap measurement sensor 14 for measuring the height of the surface of the substrate 1 which is held by the substrate chuck 2 can also be arranged in the mold stage 12.

In addition, a TTM (Through The Mold) alignment detection system 16 for aligning the mold 10 and the shot region of the substrate 1 can be arranged in the mold stage 12. The TTM alignment detection system 16 can include an optical system and an imaging system for detecting the relative positions of an alignment mark of the mold 10 and a reference mark (not shown) provided on the XY movable part 4 or the substrate chuck 2 or an alignment mark formed on the substrate 1. The TTM alignment detection system 16 can detect the positional shifts of the substrate 1 held by the substrate chuck 2 and the mold 10 held by the mold chuck 11 in the X direction and the Y direction.

A dispenser 17 supplies or arranges the imprint material onto the substrate 1. The dispenser 17 can include, for example, one or a plurality of nozzles that discharge or drop the imprint material. The dispenser 17 can be arranged to discharge very small volumes of imprint material onto the substrate 1 by, for example, a method such as a piezoelectric jet method, micro solenoid method, or the like. The imprint material can be arranged in a target position on the substrate 1 by causing the imprint material to be discharged from the nozzles of the dispenser 17 in synchronization with the driving of the substrate 1 by the substrate drive mechanism 3. The dispenser 17 can be supported by the support plate 20.

The imprint apparatus 100 can include an off-axis detection system 18. The off-axis detection system 18 can be supported by the support plate 20. The off-axis detection system 18 can include an optical system and an imaging system for detecting a reference mark (not shown) arranged on the XY movable part 4 or the substrate chuck 2 or an alignment mark formed on the substrate 1 without the intervention of the mold 10. In the imprint apparatus 100, the relative positions of the mold 10 and the XY movable part 4 or the substrate chuck 2 can be obtained by the TTM alignment detection system 16. In addition, the relative positions and the relative orientations of the substrate 1 and the XY movable part 4 or the substrate chuck 2 can be obtained by the off-axis detection system 18. The alignment of the mold 10 and the substrate 1 can be performed based on the results obtained from these systems. The TTM alignment detection system 16 also can obtain the relative positions and the relative orientations of each shot region of the substrate 1 and the pattern portion P of the mold 10.

The imprint apparatus 100 can further include a controller 19 for controlling each of the components described above. The controller 19 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general purpose computer embedded with a program, or a combination of all or some of these components.

Figure 2:
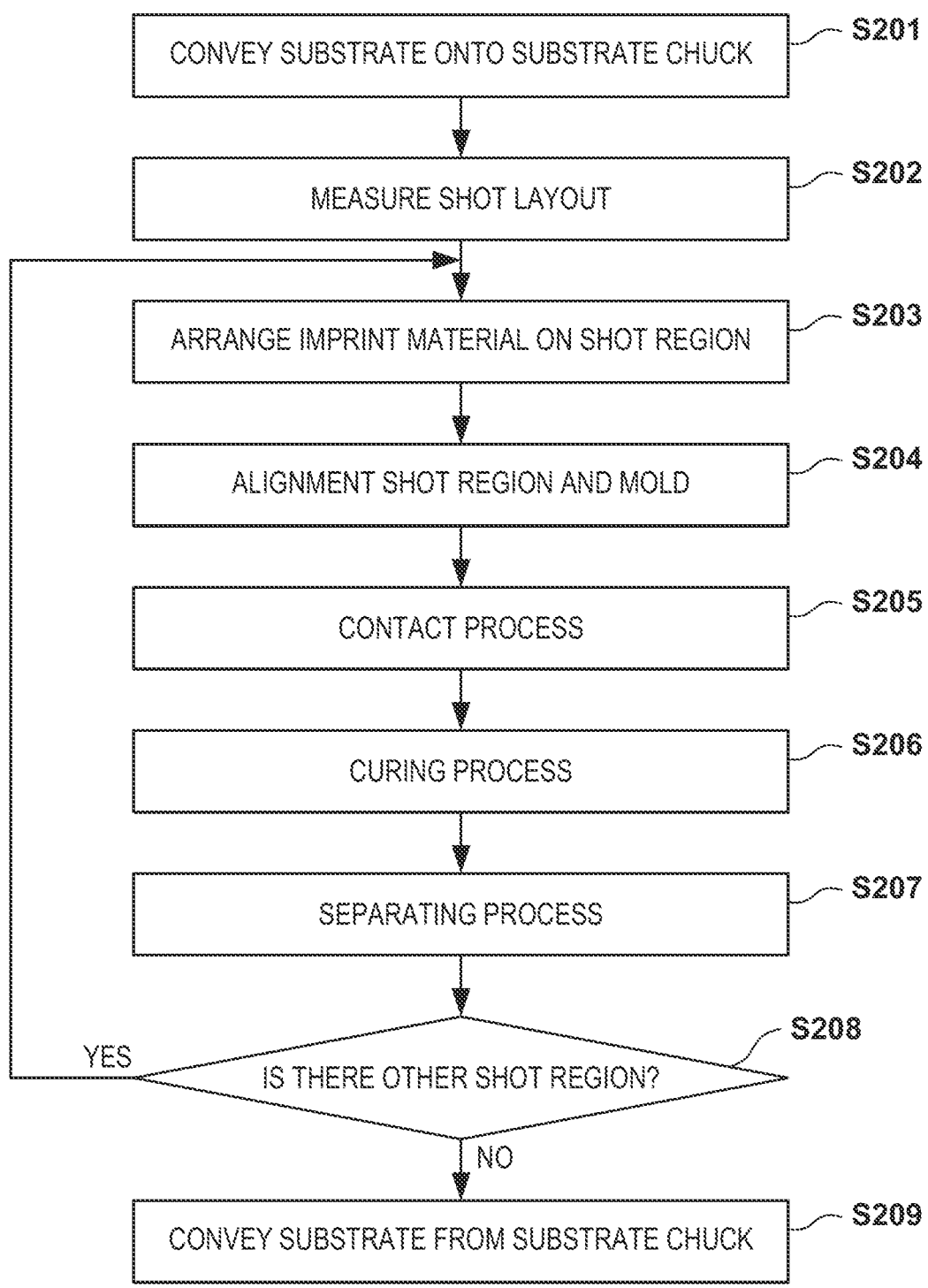
FIG. 2 is a flowchart showing the procedure of pattern formation process by the imprint apparatus according to the first embodiment of the present invention.

The procedure of a pattern formation process performed by the imprint apparatus 100 is exemplified in FIG. 2. The controller 19 controls this pattern formation process. In step S201, the substrate 1 is conveyed onto the substrate chuck 2 by a substrate conveyance mechanism (not shown), and the substrate 1 is chucked (held) by the substrate chuck 2. In step S202, the off-axis detection system 18 measures the arrangement (shot layout) of a plurality of shot regions on the substrate 1. This measurement can be performed by detecting the position of the alignment mark of shot region that has been selected among the plurality of shot regions on the substrate 1.

In step S203, the imprint material is arranged on the pattern formation target shot region by using the dispenser 17. In step S204, the substrate drive mechanism 3 positions the substrate 1, based on the measurement result obtained in step S202, so that the pattern formation target shot region will be positioned below the pattern portion P of the mold 10. Also, in step S204, the TTM alignment detection system 16 can be used to further precisely align the pattern formation target shot region and the pattern portion P of the mold 10.

An imprint process is performed in steps S205, S206, and S207. An imprint process is the process of forming a pattern made of a cured product of the imprint material on the substrate 1 by using the mold 10. First, in step S205 (contact process), the mold 10 can be driven by the mold drive mechanism 15 so as to bring (the pattern portion P of) the mold 10 into contact with the imprint material on the pattern formation target shot region. The substrate drive mechanism 3 may drive the substrate 1 so as to bring the imprint material on the pattern formation target shot region into contact with the pattern portion P of the mold 10 instead of this operation. Alternatively, the substrate drive mechanism 3 may drive the substrate 1 together with the driving of the mold 10 by the mold drive mechanism 15 so as to bring the imprint material on the pattern formation target shot region into contact with the pattern portion P of the mold 10. In step S205 (contact process), the TTM alignment detection system 16 may be used to further precisely align the pattern formation target shot region and the pattern portion P of the mold 10.

In step S206 (curing process), the curing device 13 cures the imprint material by irradiating the imprint material on the pattern formation target shot region with the curing energy via the mold 10, thereby forming a cured product of the imprint material. In step S207 (separating process), the mold drive mechanism 15 can drive the mold 10 so as to separate (the pattern portion P of) the mold 10 from the cured product of the imprint material on the pattern formation target shot region. The substrate drive mechanism 3 may drive the substrate 1 so as to separate the cure resultant of the imprint material on the pattern formation target shot region from (the pattern portion P of) the mold 10 instead of this operation. Alternatively, the substrate drive mechanism 3 may drive the substrate 1 together with the driving of the mold 10 by the mold drive mechanism 15 so as to separate the cured product of the imprint material on the pattern formation target shot region from the pattern portion P of the mold 10.

In step S208, it is determined whether there is another shot region that is to undergo the imprint process. If the presence of the other shot region is determined, the processes of steps S203 to S207 are performed on the other shot region. In the above-described example, a processing operation of arranging the imprint material on one shot region and performing the imprint process on the shot region is repeatedly performed for a plurality of shot regions. Instead of this processing operation, a processing operation of successively arranging the imprint material on two or more shot regions and subsequently performing the imprint process on these shot regions can be executed.

The conveyance of the substrate 1 to substrate chuck 2 and the conveyance of the substrate 1 from the substrate chuck 2 will be described hereinafter with reference to FIGS. 3, 4, and 5. An elevating mechanism (moving up and down mechanism) 25 for changing the space between substrate 1 and the chucking surface of the substrate chuck 2 is provided in the substrate chuck 2. The elevating mechanism 25 can include, for example, a plurality of (for example, three) support pins 24 and a drive mechanism 23 for elevating the support pins 24 that support the substrate 1. In this arrangement, the substrate 1 is received by the plurality of support pins 24 after the plurality of support pins 24 have been raised, and the support pins 24 are subsequently lowered so that the substrate 1 will be supported by the chucking surface of the substrate chuck 2. Instead of this arrangement, the elevating mechanism 25 may include a plurality of (for example, three) support pints for supporting the substrate 1 and a drive mechanism for elevating the substrate chuck 2.

In one example, a space 22 is provided inside the XY movable part 4, and the elevating mechanism 25 is arranged in the space 22. The space 22 can be arranged so as to communicate with an external space (atmospheric space) of the XY movable part 4. The elevating mechanism 25 can include, for example, a movable part that supports the plurality of support pins 24 and a drive mechanism that drives the movable part. The elevating mechanism 25 can include a guide mechanism that guides the movable part. The drive mechanism can be formed by, for example, a one-axis drive mechanism (for example, a combination of a motor and a ball screw, an air cylinder, or the like). The guide mechanism can be formed by, for example, a one-axis guide mechanism (for example, a linear guide, a ball bushing, or the like).

The substrate chuck 2 can include a first surface S1 which faces the substrate 1, a second surface S2 on a side opposite to the first surface S1, and a plurality of (for example, three) through holes 21 communicating the space on the side of the first surface S1 to the space on the side of the second surface S2. The first surface S1 forms the chucking surface for chucking the substrate 1. The support pin 24 can be arranged in each through hole 21. Alternatively, the plurality of through holes 21 can include through holes each arranged with a sensor such as a camera or the like. These through holes 21 can generate changes in the suction force used by the substrate chuck 2 to suck (vacuum suck) the substrate 1.

Figure 3:
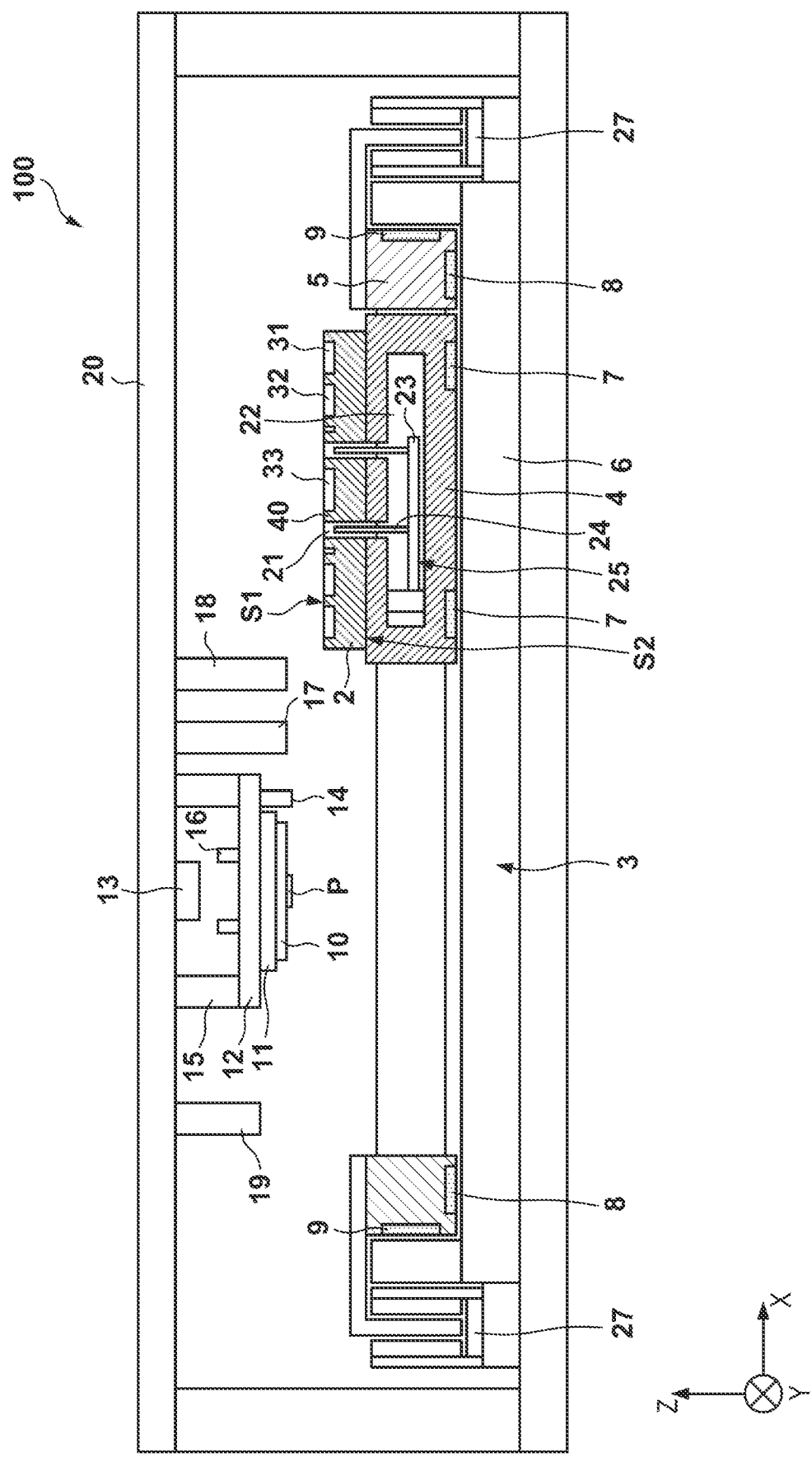
FIG. 3 is a view for explaining substrate conveyance to a substrate chuck and substrate conveyance from the substrate chuck.

FIG. 3 shows an example of a state in which the substrate chuck 2 has been positioned at a loading/unloading position for loading or unloading the substrate 1. In the state shown in FIG. 3, the plurality of support pins 24 are contained in the plurality of through holes 21, and the upper end of each of the plurality of support pins 24 is at a position lower than the upper surface (chucking surface) S1 of the substrate chuck 2.

Figure 4:
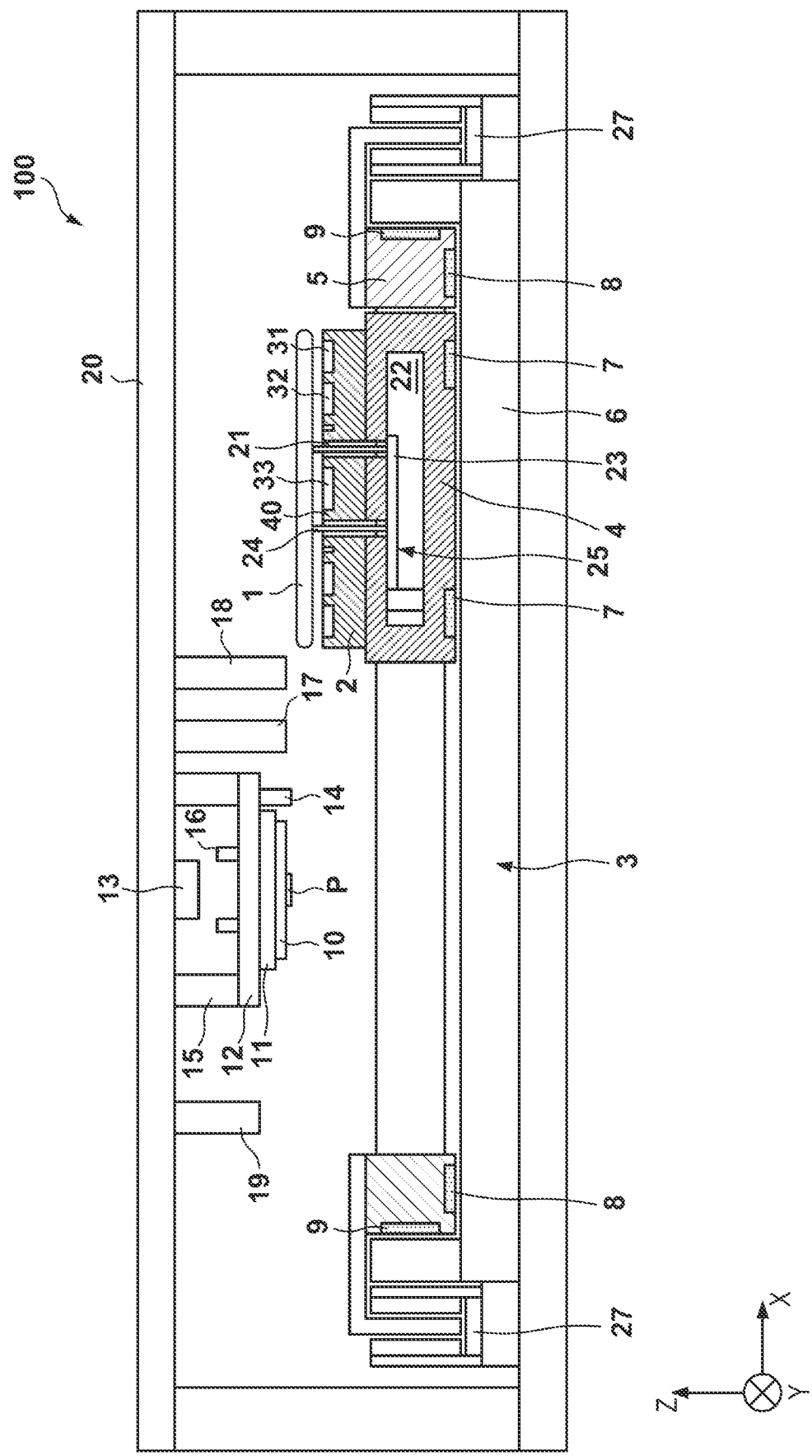
FIG. 4 is a view for explaining the substrate conveyance to the substrate chuck and the substrate conveyance from the substrate chuck.

FIG. 4 shows a state in which the substrate 1 is arranged on the plurality of support pins 24. In this state, a corresponding level difference is formed between the height of the upper ends of the plurality of support pins 24 and the height of the upper surface (chucking surface) S1 of the substrate chuck 2. Hence, when the substrate conveyance mechanism is to convey the substrate 1 to the substrate chuck 2, the substrate conveyance mechanism can chuck the lower surface of the substrate 1 by a hand and place the substrate 1 on the plurality of support pins 24. In addition, when the substrate conveyance mechanism is to convey the substrate 1 from the substrate chuck 2 to another location, the substrate conveyance mechanism can insert the hand under the substrate 1 which is supported by the plurality of support pins 24 and receive the substrate 1 by the hand.

Figure 5:
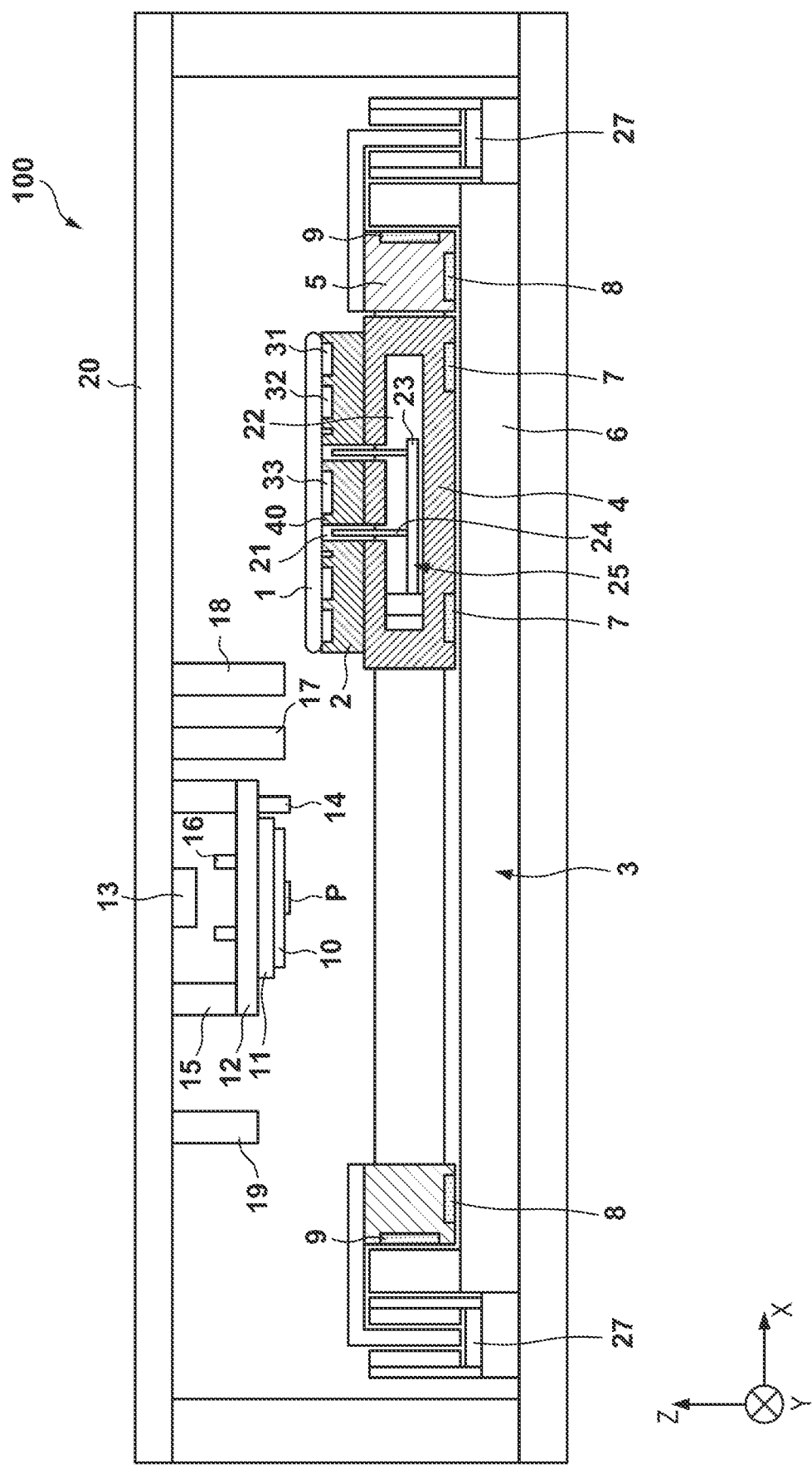
FIG. 5 is a view for explaining the substrate conveyance to the substrate chuck and the substrate conveyance from the substrate chuck.

FIG. 5 shows a state in which the substrate 1 is supported by the first surface (chucking surface) S1 of the substrate chuck 2 by lowering the plurality of support pins 24 after the plurality of support pins 24 received the substrate 1. The state shown in FIG. 5 is also a state in which the substrate chuck 2 is positioned at the loading/unloading position to unload substrate 1 from the imprint apparatus 100. A state in which the substrate conveyance mechanism can receive the substrate 1 is set by causing the plurality of support pins 24 to support the substrate 1 by raising the plurality of support pins 24 in this state as shown in FIG. 4.

Figure 6A:
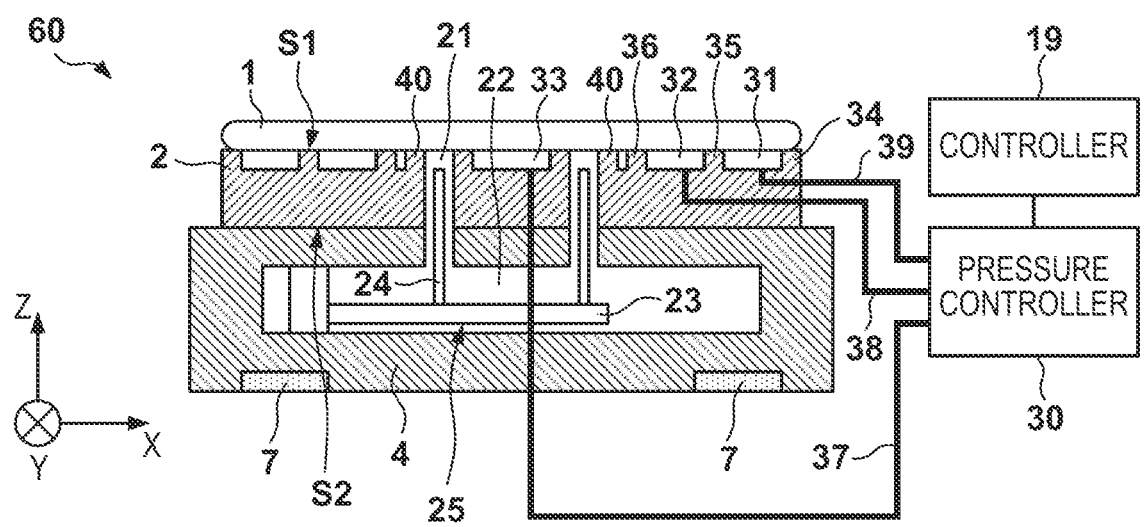
FIGS. 6A and 6B are a sectional view and a plan view, respectively, showing examples of the structure of the substrate chuck and its periphery.
Figure 6B:
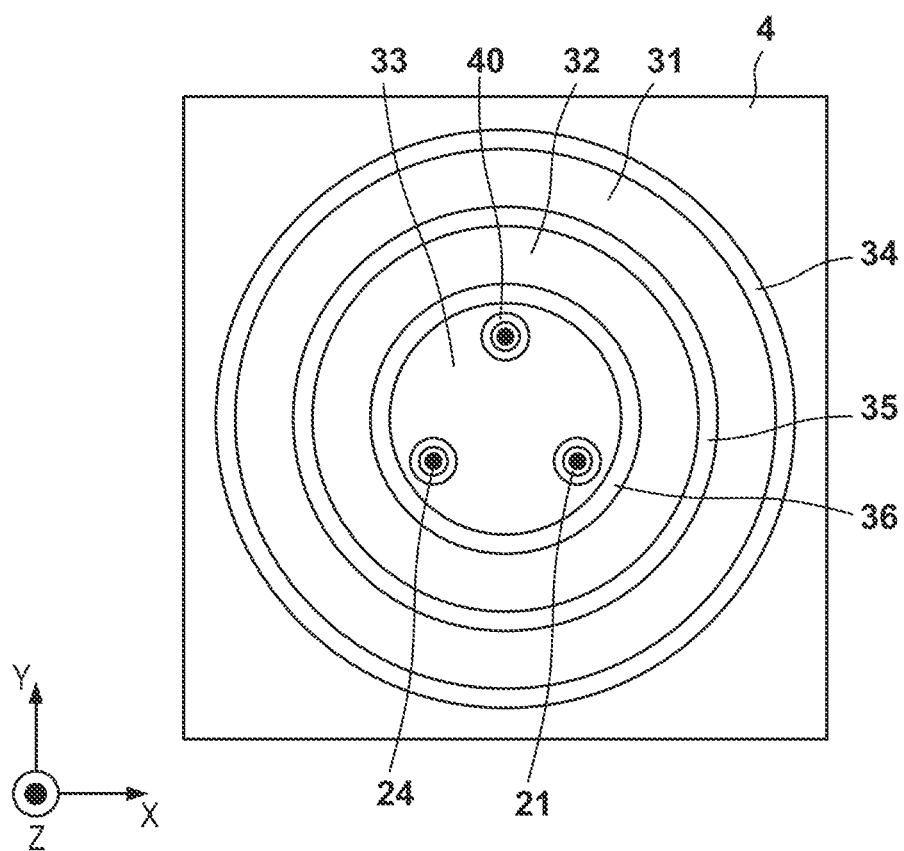

FIGS. 6A and 6B show examples of the structure of the substrate chuck 2 and its periphery. An outer groove 31, an intermediate groove (second groove) 32, and an inner groove (first groove) 33 can be arranged, for example, as a plurality of suction units whose suction forces for sucking (vacuum suction) the substrate 1 can be controlled independently in the first surface of the substrate chuck 2. The outer groove, the intermediate groove, and the inner groove may also be referred as an outer concave portion, an intermediate concave portion, and an inner concave portion, respectively. The outer edge of the outer groove 31 is defined by an outer ring bank 34, and the inner edge of the outer groove 31 is defined by an intermediate ring bank 35. The outer edge of the intermediate groove 32 is defined by the intermediate ring bank, and the inner edge of the intermediate groove 32 is defined by an inner ring bank 36. The outer edge of the inner groove 33 is defined by the inner ring bank 36. A plurality of separation banks 40 surrounding the corresponding through holes 21 are arranged in the inner groove 33. Each separation bank 40 functions to spatially separate the space of the inner groove 33 and the through hole 21 in a state in which the substrate 1 is arranged on the upper surface S1 of the substrate chuck 2.

The pressure in the space inside the outer groove 31 can be controlled by a pressure controller (controller) 30 via a connection line 39. The pressure in the space inside the intermediate groove 32 can be controlled by the pressure controller 30 via a connection line 38. The pressure in the space inside the inner groove 33 can be controlled by the pressure controller 30 via a connection line 37. The substrate chuck 2 and the pressure controller 30 can form the substrate holding mechanism 60. The substrate holding mechanism 60 suppresses a state in which the suction force by which the substrate chuck 2 sucks the substrate 1 is reduced due to the through holes 21 and a gap which is formed between the back surface of the substrate 1 and the upper surface (the first surface S1) of the substrate chuck 2 in the separating process.

The pressure controller 30 can be formed to independently control the pressure in the space inside the outer groove 31, the pressure in the space inside the intermediate groove 32, and the pressure in the space inside the inner groove 33 under the instruction from the controller 19. The substrate chuck 2 can suck (vacuum suck), out of the entire back surface of the substrate 1, a region facing the outer groove 31 when the pressure controller 30 reduces the pressure in the space inside the outer groove 31. The substrate chuck 2 can suck (vacuum suck), out of the entire back surface of the substrate 1, a region facing the intermediate groove 32 when the pressure controller 30 reduces the pressure in the space inside the intermediate groove 32. The substrate chuck 2 can suck (vacuum suck), out of the entire back surface of the substrate 1, a region facing the inner groove 33 when the pressure controller 30 reduces the pressure in the space inside the inner groove 33.

Figure 7:
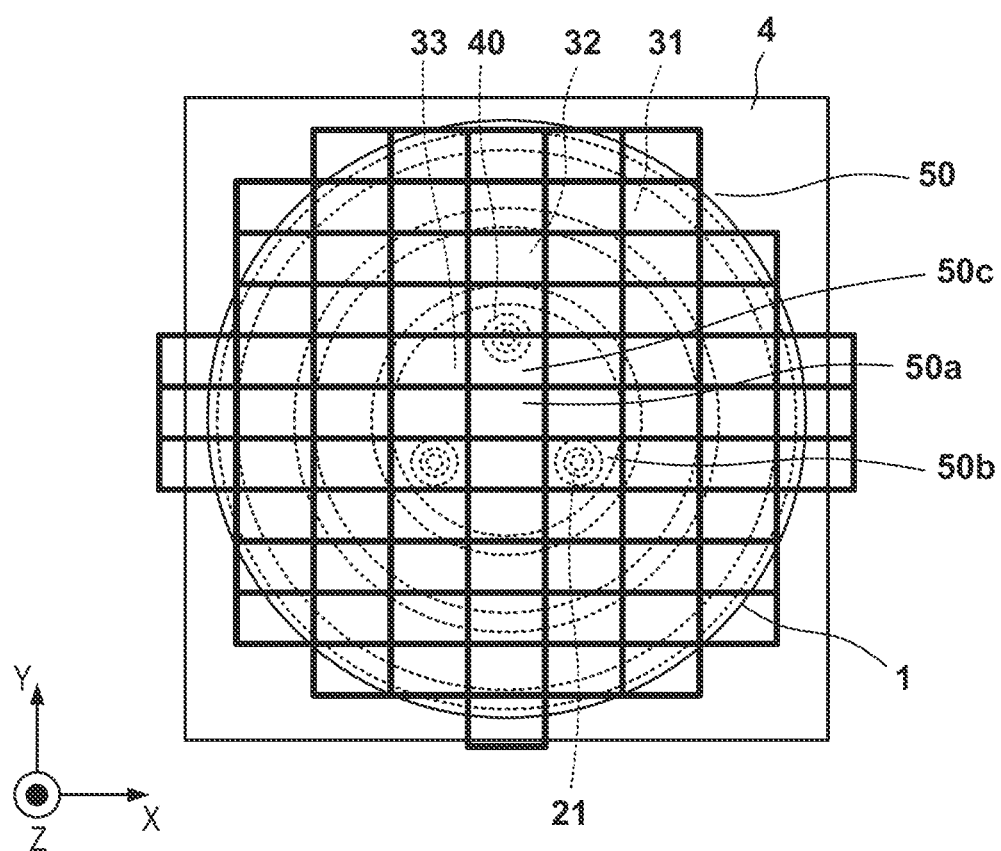
FIG. 7 is a view showing an example of the relationship between a shot layout and through holes.

FIG. 7 shows an example of the arrangement (shot layout) of a plurality of shot regions 50 of the substrate 1. Each thick-lined rectangle indicates the shot region 50. Note that each rectangle including the outer side region of the edge of the substrate 1 indicates a partial shot region. A partial shot region is a shot region whose shape is defined by the edge of the substrate 1.

Shot regions which are at least partially arranged on the inner groove 33 can be categorized into a plurality of types in accordance with their relative positions with respect to the through holes 21. The shot region 50 of the first type is a shot region which does not include the through hole 21 such as, for example, a shot region 50a. The shot region 50 of the second type is a shot region which has the through hole 21 such as, for example, the shot region 50b. The shot region 50 of the third type is a shot region which has a part of the through hole 21 such as, for example, a shot region 50c.

Figure 8A:
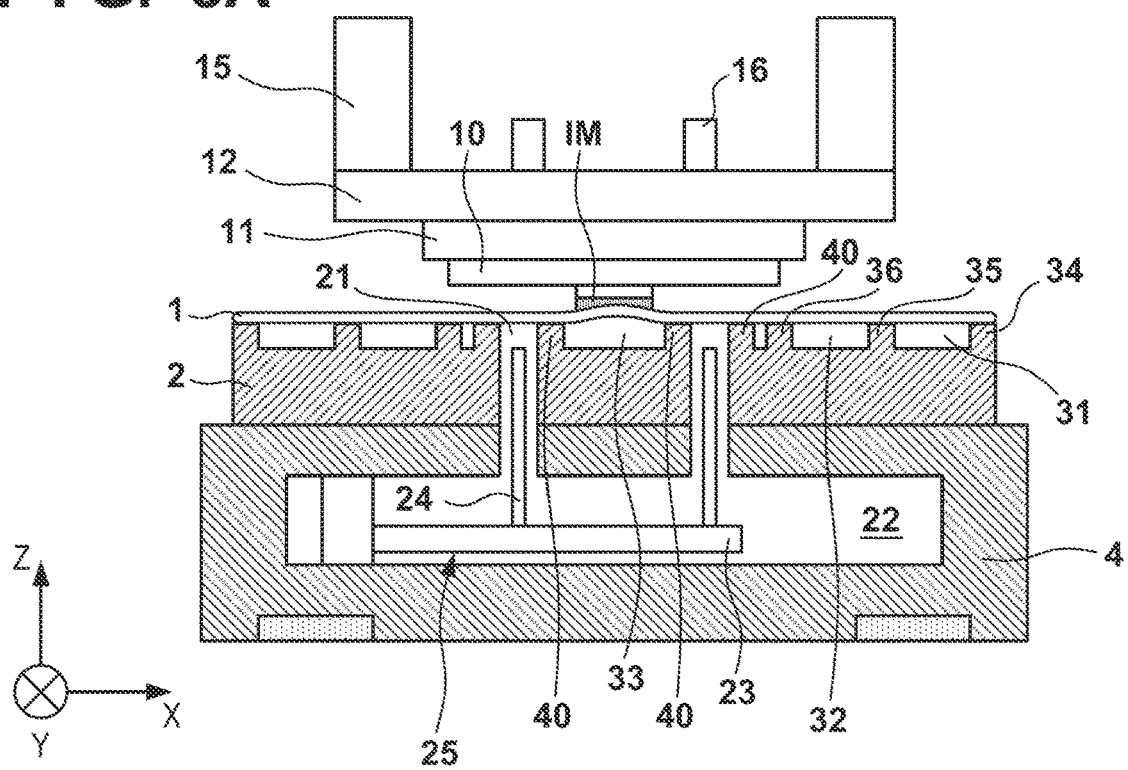
FIGS. 8A and 8B are views for explaining a problem.
Figure 8B:
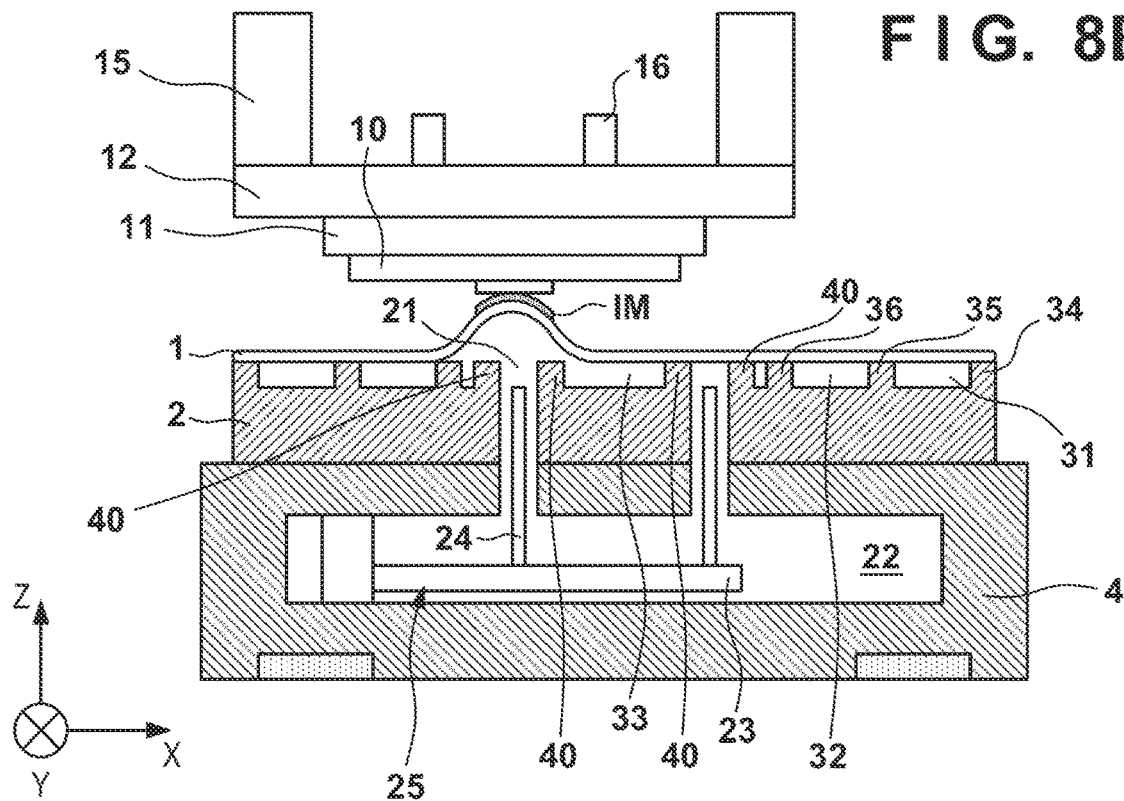

FIGS. 8A and 8B schematically show the shape of the substrate 1 when pressure control is performed in the outer groove 31, the intermediate groove 32, and the inner groove 33 without considering the relative position of each shot region with respect to the corresponding through hole 21 in the separating process of the imprint process performed on the shot regions 50a and 50b. FIG. 8A schematically shows the shape of the substrate 1 in the separating process (step S207) of the imprint process performed on the shot region 50a which does not include the through hole 21. FIG. 8B schematically shows the shape of the substrate 1 in the separating process (step S207) of the imprint process performed on the shot region 50b which has the through hole. In the following description, let reference symbols P1, P2, and P3 represent the pressure of the inner groove 33, the pressure of the intermediate groove 32, and the pressure of the outer groove 31, respectively. Assume that each pressure has a negative value. The fact that the absolute values of the respective pressures P1, P2, and P3 are small represents that the forces by which the respective inner groove 33, the intermediate groove 32, and the outer groove 31 suck the substrate 1 are small, and the fact that the absolute values of the respective pressures P1, P2, and P3 are large represents that the suction forces by which the respective inner groove 33, the intermediate groove 32, and the outer groove 31 suck (vacuum suck) the substrate 1 are large.

In the example shown in FIG. 8A, in the separating process of the imprint process on the shot region 50a, the absolute value of the pressure P1 of the inner groove 33 positioned below the pattern portion P of the mold 10 is set to be smaller than the absolute value of the pressure P2 of the intermediate groove 32 and the absolute value of the pressure P3 of the outer groove 31. In one example, assume that P1=−10 kPa and P2=P3=−70 kPa. By performing control in this manner, the substrate 1 is deformed in the separating process so that the portion of the shot region 50a will have an upward convex shape by driving the mold 10 upward, and it becomes possible to reduce the distortion and defects generated in the pattern formed from a cured product of an imprint material IM.

In the example shown in FIG. 8B, the pressures P1, P2, and P3 in the separating process of the imprint process on the shot region 50b are equal to the pressures P1, P2, and P3 in the separating process of the imprint process on the shot region 50b shown in FIG. 8A. In this case, a gap is formed between the back surface of the substrate 1 and the upper surface of the separation bank 40 when the substrate 1 is deformed so that the portion of the shot region 50b will have an upward convex shape, and this gap will allow the space inside the inner groove 33 to communicate with the space 22 which communicates with the external space. Hence, the absolute value of the pressure P1 in the space inside the inner groove 33 becomes small (that is, the suction force of the inner groove 33 for chucking (vacuum chucking) the substrate 1 becomes small). As a result, the deformation amount of the substrate 1 in the portion of the shot region 50b can exceed the target deformation amount and can become large. Therefore, there is a possibility that this will increase the distortion and defects generated in the pattern formed from the cured product of the imprint material IM. In addition, the driving amount of the mold 10 required to separate the pattern portion P of the mold 10 from the cured product of the imprint material IM can become larger than the target driving amount. This means that the time required for the separating process will be prolonged.

From the above description, it can be understood that the suction force for sucking the substrate 1 in the separating process of the imprint process performed on a region near the through hole 21 need to be made stronger than that in the separating process of the imprint process performed on a region far the through hole 21. Therefore, in the first embodiment, the controller 19 will cause the pressure controller 30 to set the suction force for sucking the substrate 1 in the separating process of the imprint process on a shot region near the through hole 21 to be stronger than the suction force in the separating process of the imprint process on a shot region far from the through hole 21.

Figure 9A:
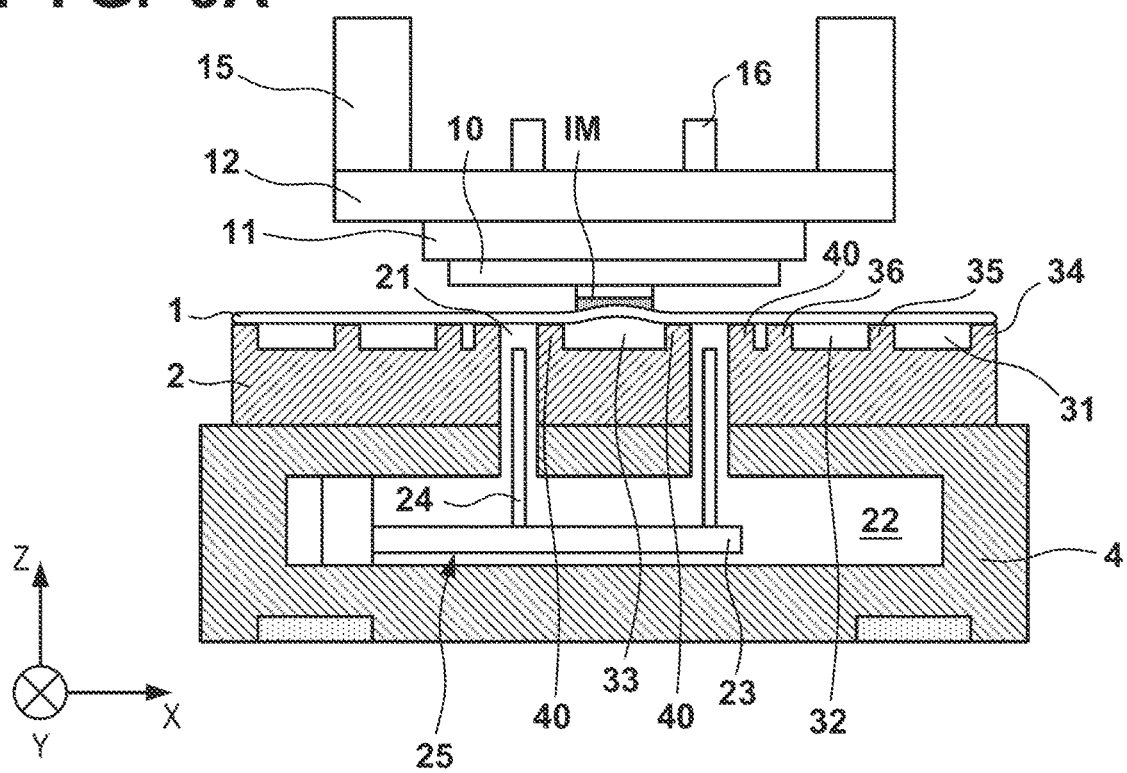
FIGS. 9A and 9B are views showing examples of an operation of the imprint apparatus according to the first embodiment of the present invention.
Figure 9B:
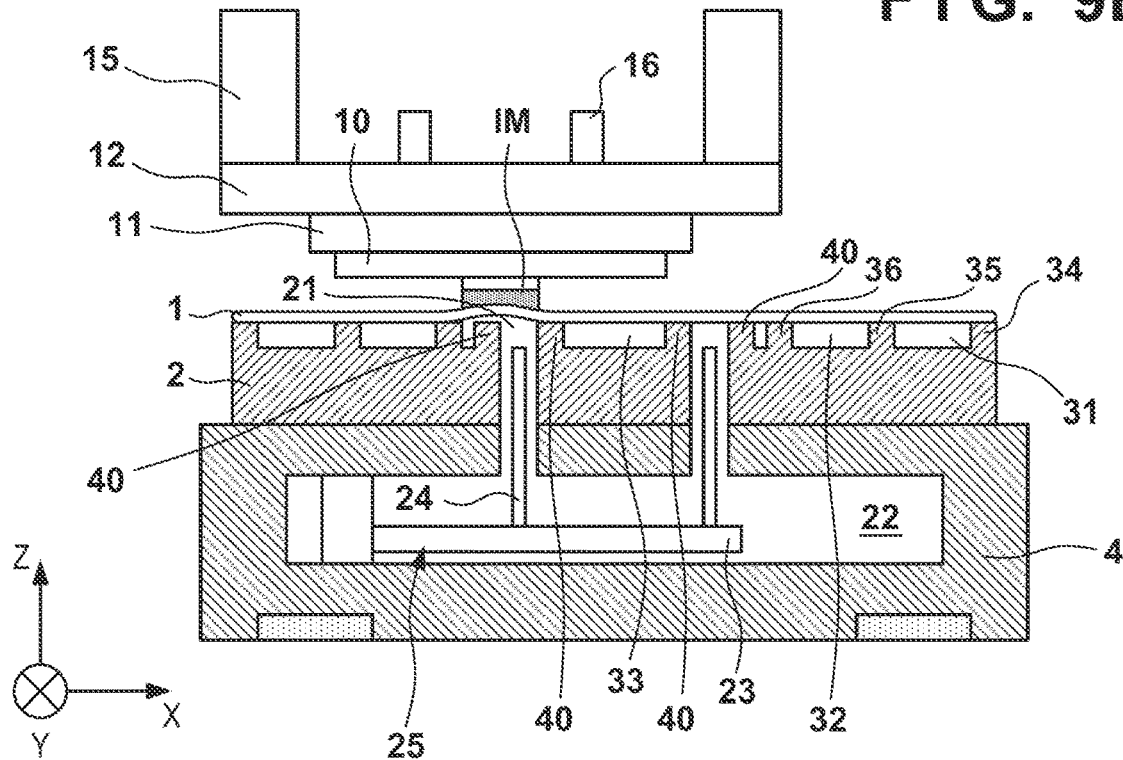

FIGS. 9A and 9B schematically show the shape of the substrate 1 when pressure control is performed on the outer groove 31, the intermediate groove 32, and the inner groove 33 with consideration to the relative position of the shot region with respect to the corresponding through hole 21 in the separating process of the imprint process on the shot regions 50a and 50b. FIG. 9A schematically shows the shape of the substrate 1 in the separating process (step S207) of the imprint process on the shot region 50a which does not include the through hole. FIG. 9B schematically shows the shape of the substrate 1 in the separating process (step S207) of the imprint process on the shot region 50b which has the through hole.

In the example shown in FIG. 9A, the pressure controller 30 performs control, in the separating process of the imprint process on the shot region 50a, so that the pressures P1, P2, and P3 will have values equal to those of the pressures P1, P2, and P3, respectively, of the example shown in FIG. 8A. On the other hand, in the example shown in FIG. 9B, the pressure controller 30 performs control, in the separating process of the imprint process on the shot region 50b, so that the absolute value of the pressure P1 will be larger than the absolute value of the pressure P1 in the example shown in FIG. 8B. That is, in the example shown in FIG. 9B, the pressure controller 30 will set the suction force to be larger than that in the example shown in FIG. 8B. In one example, assume that P1=−20 kPa and P2=P3=−70 kPa. As a result, even if the space inside the inner groove 33 and the space 22 communicate via the gap formed between the back surface of the substrate 1 and the upper surface of the separation bank 40, it is possible to suppress a reduction in the suction force caused by this state. That is, the deformation amount of the substrate 1 in the portion of the shot region 50b can be suppressed from exceeding the target deformation value and becoming large. Therefore, the deformation amount of the substrate 1 in the separating process can be controlled to be the target deformation amount, and it is possible to reduce the deformation and defects generated in the pattern formed by the cured product of the imprint material IM. In addition, by performing such control, it becomes possible to suppress the driving amount of the mold 10 required to separate the pattern portion P of the mold 10 from the cured product of the imprint material IM from becoming larger than the target driving amount, and suppress the time required for the separating process from being prolonged.

Figure 10:
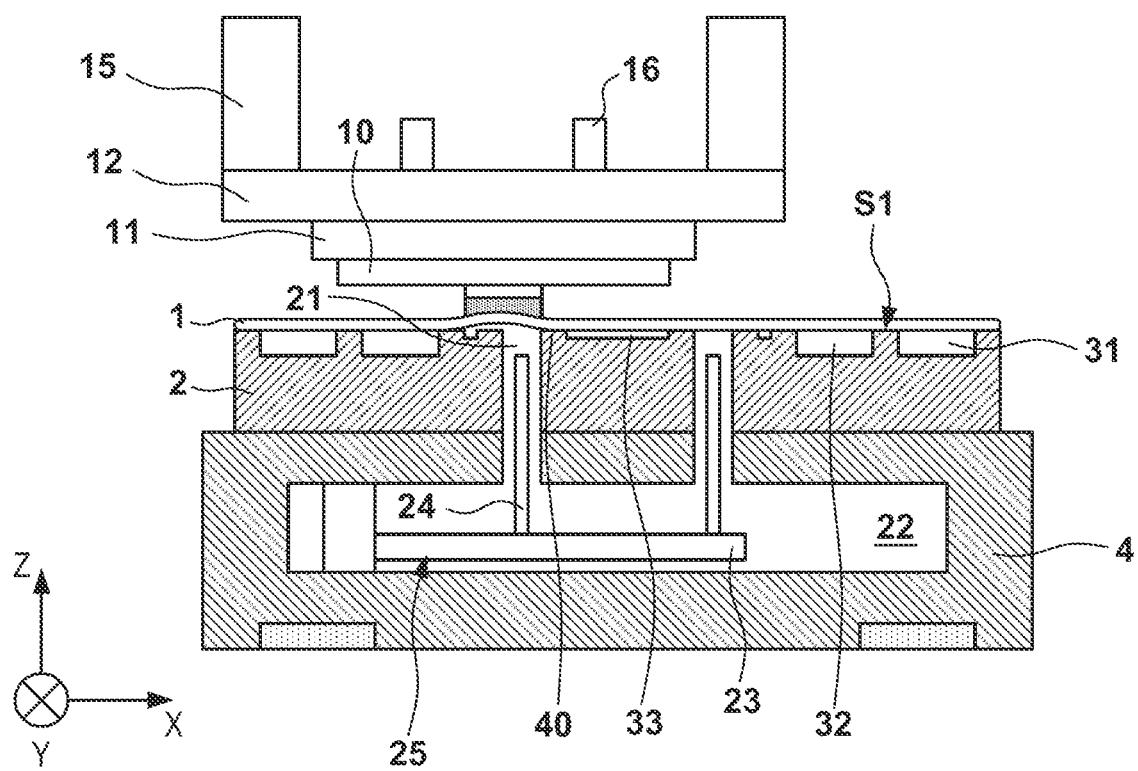
FIG. 10 is a view showing a modification of the imprint apparatus according to the first embodiment of the present invention.

In addition to the control described above or instead of the control described above, it is also effective to set the depth of the inner groove 33, in which each through hole 21 is arranged, to be smaller than the depths of the other grooves, that is, the depths of the intermediate groove 32 and the outer groove 31 as exemplarily and schematically shown in FIG. 10. Assume here that the depth is the depth from the first surface (chucking surface) S1. This will reduce the volume defined by the inner groove 33. According to this arrangement, even if air flows in from each through hole 21 to the inner groove 33, pressure reduction in the inner groove 33 can be suppressed because the pressure gradient between the space inside the inner groove 33 and each through hole 21 will be increased by the pressure drag generated by the inflow of air. As a result, the reduction of the suction force in the separating process can be suppressed. For example, in a case in which the pressure P1 in the example shown in FIG. 9B is −20 kPa, it is possible to set P1=−15 kPa in the example shown in FIG. 10.

In a case in which a sucking operation is performed under the same condition in the separating process, the deformation amount of the shot region 50c (a shot region in which the through hole 21 is partially present) of the third type can be a deformation amount between that of the shot region 50a of the first type and that of the shot region 50b of the second type. Hence, the pressure P1 in the separating process of the imprint process on the shot region 50c can be set to a value between the value of the pressure P1 in the separating process of the imprint process on the shot region 50a and the value of the pressure P1 in the separating process of the imprint process on the shot region 50b.

In addition, for each shot region in which a gap can be formed between the back surface of the substrate 1 and the first surface S1 of the substrate chuck 2 due to the deformation of the substrate 1 in the separating process, the suction force (pressure) of the substrate chuck 2 (the inner groove 33) can be determined in consideration of this gap.

Suction force reduction due to the deformation of the substrate 1 in the separating process depends on the size of the gap formed between the back surface of the substrate 1 and the first surface S1 of the substrate chuck 2, and this gap will become smaller the farther the shot region is from the through hole 21. Hence, the pressure controller 30 can set the suction force (the pressure P1 in the inner groove 33) of the substrate chuck 2 (the inner groove 33) in accordance with the distance of the pattern formation target shot region from the through hole 21. More specifically, the closer the distance is to the pattern formation target shot region from the through hole 21, the pressure controller 30 can set the substrate chuck 2 (the inner groove 33) to have a large suction force (the absolute value of the pressure P1 in the inner groove 33).

Figure 13:
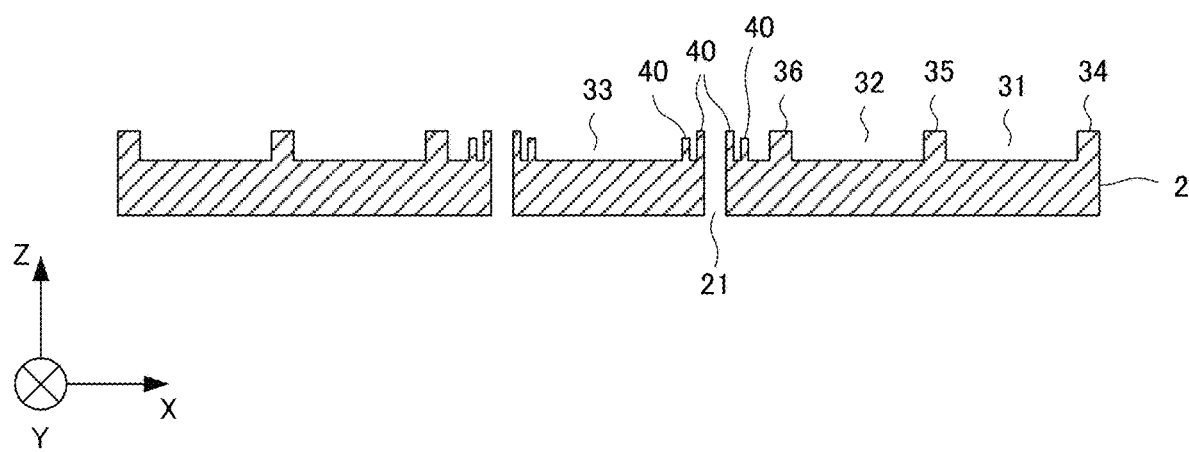
FIG. 13 illustrates another embodiment that includes a plurality of separation banks with upper surfaces thereof being at different heights.

Although one separation bank 40 is arranged around each through hole 21 in the example described above, a plurality of separation banks 40 may be concentrically arranged around each through hole 21. This arrangement is advantageous in reducing the inflow of air from each through hole 21 to the inner groove 33. In this case, the upper surface of the separation bank 40 at the innermost side can be set to the same height as the upper surfaces (that is, the first surface S1) of the outer ring bank 34, the intermediate ring bank 35, and the inner ring bank 36, and the upper surface of the separation bank 40 on the outer side can be set lower than the first surface S1, as illustrated in FIG. 13. This arrangement is advantageous in preventing the substrate 1 from being deformed due to a foreign object adhering to the upper surface of the separation bank 40 on the outer side while suppressing the inflow of air from each through hole 21 to the inner groove 33.

Although the chucking region of the substrate chuck 2 is divided into the three areas of the outer groove 31, the intermediate groove 32, and the inner groove 33 in the example described above, the chucking region may be formed by one region. The chucking region of the substrate chuck 2 may also be formed by four or more regions.

Although the plurality of through holes 21 have been provided for the support pins 24, the plurality of through holes 21 may be through holes used for sensors such as cameras or the like arranged at the lower portion of the substrate chuck 2. Through holes for such sensors can also have an effect of reducing the suction force by which the inner groove 33 sucks the substrate 1. Each camera can be used, for example, to detect a mark arranged on the back surface of the substrate 1. Each sensor may be, for example, a temperature sensor or the like.

Figure 11A:
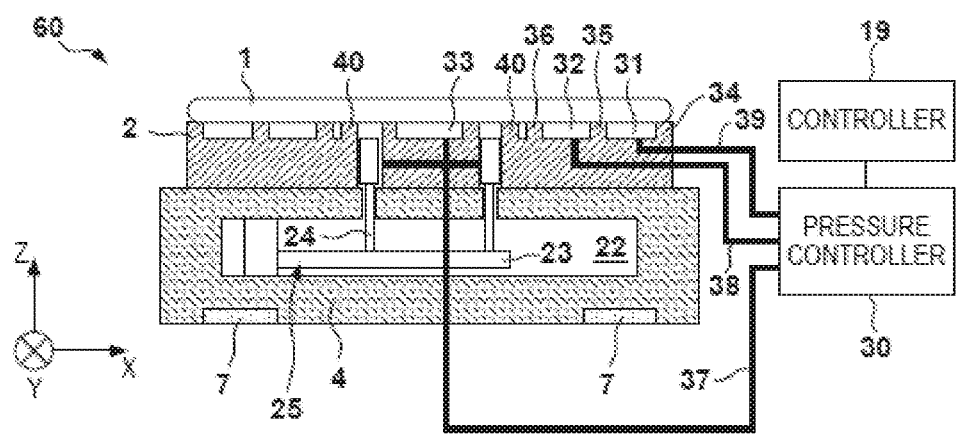
FIG. 11A is a view showing the arrangement of an imprint apparatus according to the second embodiment of the present invention.
Figure 11B:
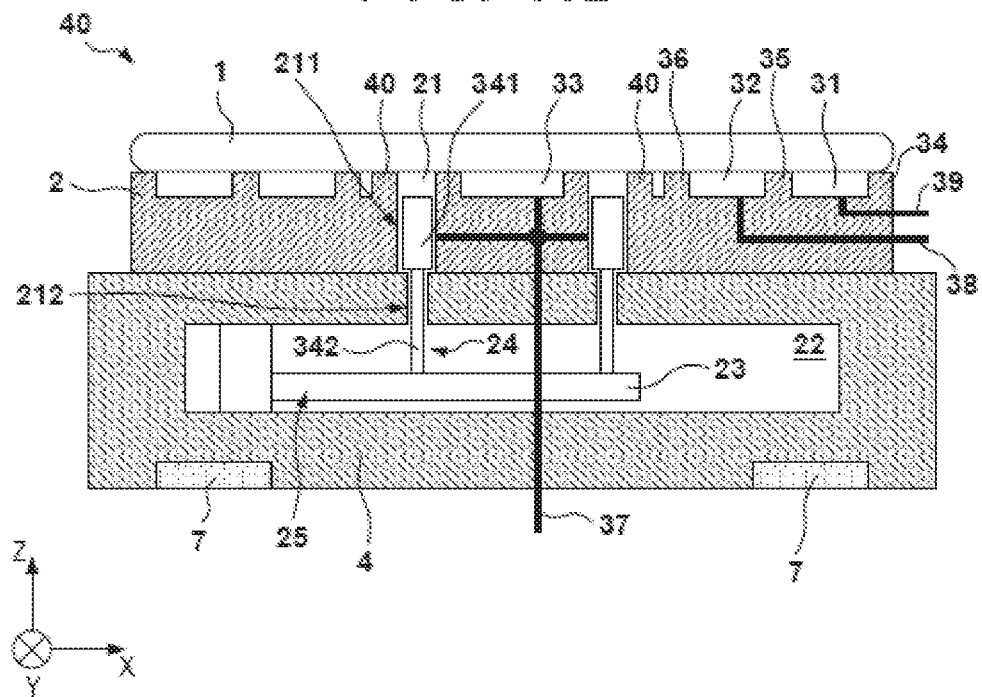
FIG. 11B is an enlarged view of a part of FIG. 11A.

An imprint apparatus 100 according to the second embodiment of the present invention will be described with reference to FIGS. 11A and 11B. FIGS. 11A and 11B show only a partial arrangement of the imprint apparatus 100. Matters not mentioned in the second embodiment can follow those described the first embodiment. In the second embodiment, each through hole 21 has a first through hole 211 and a second through hole 212 which has a smaller diameter than the first through hole 211 and is arranged between the first through hole 211 and a space 22. In the example of FIGS. 11A and 11B, each first through hole 211 is arranged in a substrate chuck 2 and each second through hole 212 is arranged in an XY movable part 4, and the upper surface of the XY movable part 4 forms the boundary between each first through hole 211 and each second through hole 212. This arrangement is superior in the point that the processing for the formation of the through holes 21 can be performed easily. However, the boundary between each first through hole 211 and each second through hole 212 may be present in the substrate chuck 2 or the XY movable part 4. At least a part of the through hole 21 is arranged in the substrate chuck 2. Each support pin 24 includes a first portion 341 and a second portion 342 which has a smaller diameter than the first portion 341 and is arranged between the first portion and a drive mechanism 23.

In a state in which each support pin 24 has been lowered to the bottom end, the first portion 341 of each support pins 24 is supported by a step (the upper surface of the XY movable part 4 in the example shown in FIGS. 11A and 11B) which is present in the boundary between the first through hole 211 and the second through hole 212. As a result, the first through hole 211 and the space 22 are spatially separated by the support pin 24. A sealing member such as an O-ring can be arranged between the lower end of the first portion 341 and the upper end of the second through hole 212. In addition, a connection line 37 or another connection line can be connected to each first through hole 211 so a pressure controller 30 can control the pressure of the first through hole 211.

According to the second embodiment, the same effects as those of the first embodiment can be obtained since it is difficult for the absolute value of the pressure (negative value) in an inner groove 33 to decrease in the separating process of the imprint process on shot regions 50b and 50c. The second embodiment may be used in combination with the pressure control by the pressure controller 30 according to the first embodiment.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
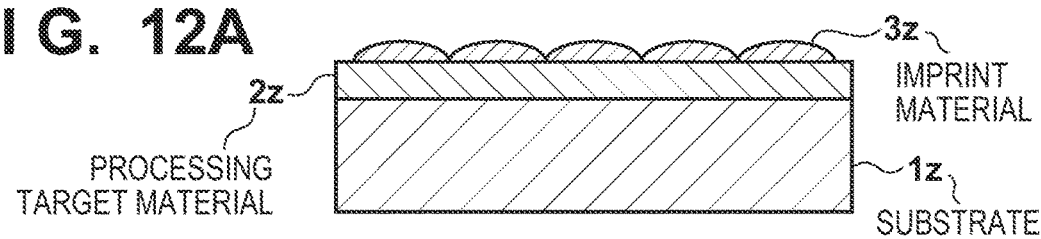
FIGS. 12A to 12F are views exemplifying a method of manufacturing an article.

An article manufacturing method of forming a pattern on a substrate by an imprint apparatus, processing the substrate on which the pattern has been formed, and manufacturing an article from the processed substrate will be described next. As shown in FIG. 12A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 12B:
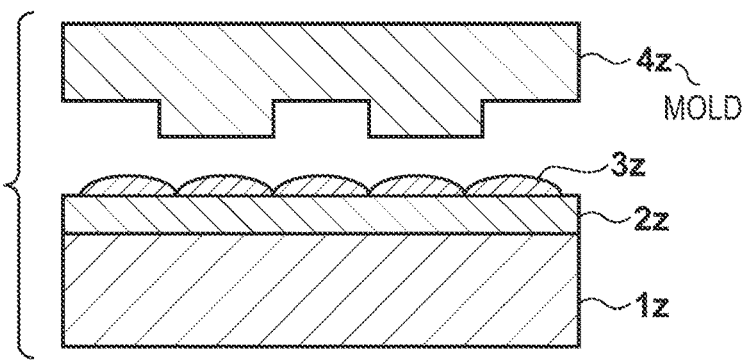
Figure 12C:
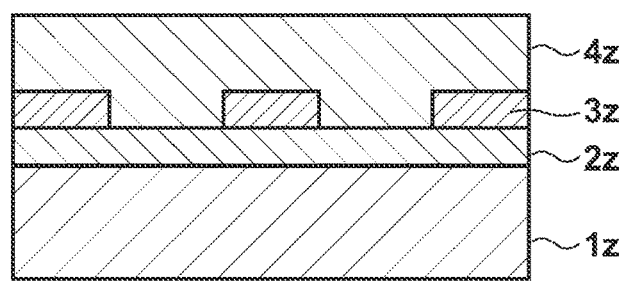

As shown in FIG. 12B, a side of a mold 4z for imprint with an uneven pattern is directed to and caused to face the imprint material 3z on the substrate. As shown in FIG. 12C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

Figure 12D:
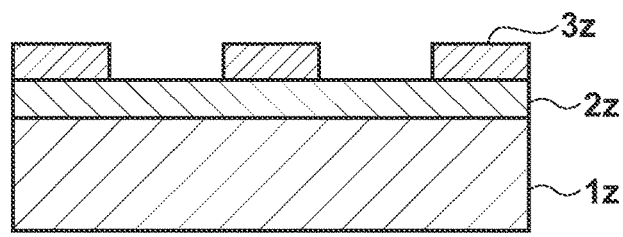

As shown in FIG. 12D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 12E:
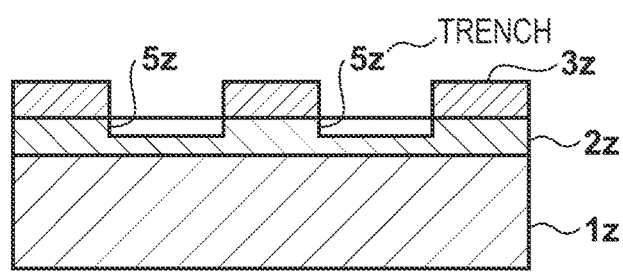
Figure 12F:
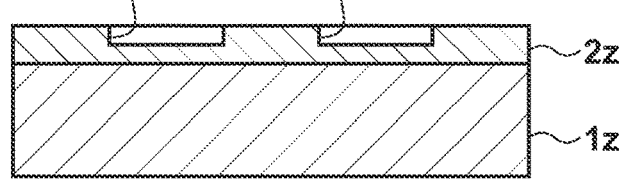

As shown in FIG. 12E, when etching is performed using the pattern of the cured product as an etching resistant mask, a portion of the surface of the processed material 2z where the cured product does not exist or remains thin is removed to form a groove 5z. As shown in FIG. 12F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-085724, filed Apr. 26, 2018, which is hereby incorporated by reference herein in its entirety.

What is claimed is:

1. An imprint apparatus for forming a cured product of an imprint material on a substrate by an imprint process including a process of bringing the imprint material on the substrate into contact with a mold, a process of curing the imprint material, and a separating process of separating the cured product of the imprint material and the mold, the apparatus comprising:
a substrate holding mechanism including a substrate chuck configured to chuck the substrate by sucking the substrate,
wherein the substrate chuck includes:
a plurality of separation banks separated from each other, each of the plurality of separation banks including an upper surface forming part of an upper surface of the substrate chuck;
a plurality of through holes each surrounded by a corresponding one of the plurality of separation banks;
a ring bank including a surface forming part of the upper surface of the substrate chuck; and
a plurality of recesses including a first recess and a second recess that are separated by the ring bank,
wherein each of the plurality of separation banks is arranged to protrude from a bottom surface of the first recess and surrounded by an inner surface of the ring bank, the bottom surface being spaced apart from a back surface of the substrate in a state where the substrate is chucked by the substrate chuck, and
wherein the substrate holding mechanism suppresses a gap from being formed between the back surface of the substrate and the supper surfaces of the plurality of separation banks in the separation process.

2. The apparatus according to claim 1, wherein:
the substrate holding mechanism includes a pressure controller configured to control the suction force by which the substrate chuck sucks the substrate,
the substrate includes a first shot region and a second shot region farther from one of the plurality of through holes than the first shot region, and
the pressure controller controls the suction force in the separating process of the imprint process on the first shot region to be stronger than the suction force in the separating process of the imprint process on the second shot region.

3. The apparatus according to claim 2, wherein:
the pressure controller controls suction forces by the plurality of recesses independently, and
the first shot region and the second shot region are arranged on the first recess.

4. The apparatus according to claim 3, wherein a depth of the first recess is smaller than a depth of the second recess.

5. The apparatus according to claim 1, wherein the side surfaces of the plurality of separation banks facing each other are spaced apart by the plurality of recesses.

6. The apparatus according to claim 1, wherein each of the plurality of separation banks is arranged concentrically surrounding one of the plurality of through holes.

7. The apparatus according to claim 6, wherein:
each of the plurality of separation banks includes a first separation bank arranged in an innermost side and a second separation bank arranged on an outer side of the first bank, and
a height of an upper surface of the second bank is lower than a height of an upper surface of the first bank.

8. The apparatus according to claim 1, wherein:
the substrate holding mechanism further includes:
a support pin extending in one through hole among the plurality of through holes; and
a drive mechanism for elevating the support pin, and
the support pin:
supports the substrate in a state where the support pin protrudes from the one through hole; and
does not support the substrate in a state where the support pin does not protrude from the one through hole.

9. The apparatus according to claim 8, wherein a space on the side of the upper surface of the substrate chuck and a space on the side of the lower surface of the substrate chuck are separated in a state where the support pin has been lowered.

10. The apparatus according to claim 9, wherein a state where the suction force is reduced due to the gap being formed in the separating process is suppressed by the separation of the space on the side of the upper surface of the substrate chuck and the space on the side of the lower surface of the substrate chuck.

11. The apparatus according to claim 10, wherein:
the second through hole is smaller than the first through hole and is arranged between the first through hole and the space on the side of the lower surface of the substrate chuck, and
the support pin includes a first portion and a second portion that has a smaller diameter than that of the first portion and is arranged between the first portion and the drive mechanism.

12. The apparatus according to claim 11, wherein:
a boundary between the first through hole and the second through hole includes a stepped portion, and
the stepped portion supports the first portion in the state where the support pin has been lowered to a bottom end.

13. The apparatus according to claim 12, wherein a sealing member is arranged between a lower end of the first portion and an upper end of the second through hole.

14. The apparatus according to claim 11, wherein the state of the suction force is suppressed due to the gap formed in the separating process being suppressed by controlling pressure in the first through hole via a connection line communicating with the first through hole.

15. An imprint apparatus for forming a cured product of an imprint material on a substrate by an imprint process including a process of bringing the imprint material on the substrate into contact with a mold, a process of curing the imprint material, and a separating process of separating the cured product of the imprint material and the mold, the apparatus comprising:

a substrate chuck configured to chuck the substrate by sucking the substrate; and a pressure controller configured to control a suction force by which the substrate chuck sucks the substrate, wherein the substrate chuck includes:

a plurality of separation banks separated from each other, each of the plurality of separation banks including an upper surface forming part of an upper surface of the substrate chuck;

a plurality of through holes each surrounded by a corresponding one of the plurality of separation banks;

a ring bank including a surface forming part of the upper surface of the substrate chuck; and a plurality of recesses, whose suction forces are independently controllable by the pressure controller, including a first recess and a second recess that are separated by the ring bank, wherein each of the plurality of separation banks is arranged to protrude from a bottom surface of the first recess and surrounded by an inner surface of the ring bank, the bottom surface being spaced apart from a back surface of the substrate in a state where the substrate is chucked by the substrate chuck, wherein the substrate includes a first shot region and a second shot region arranged at a position farther from one of the plurality of through holes than the first shot region, and wherein the pressure controller sets the suction force by which the substrate chuck sucks the first shot region in the separating process of the imprint process on the first shot region to be stronger than the suction force by which the substrate chuck sucks the second shot region in the separating process of the imprint process on the second shot region.

16. The apparatus according to claim 1, wherein the gap formed between the back surface of the substrate and the upper surfaces of the plurality of separation banks in the separating process is formed by the substrate, which deforms so that part of the substrate is convexly shaped toward the mold.

17. An imprint apparatus for forming a cured product of an imprint material on a substrate by an imprint process including a process of bringing the imprint material on the substrate into contact with a mold, a process of curing the imprint material, and a separating process of separating the cured product of the imprint material and the mold, the apparatus comprising:

a substrate holding mechanism including a substrate chuck configured to chuck the substrate by sucking the substrate, wherein the substrate chuck includes:

a plurality of separation banks separated from each other, each of the plurality of separation banks including an upper surface forming part of an upper surface of the substrate chuck;

a plurality of through holes each surrounded by a corresponding one of the plurality of separation banks;

a ring bank including a surface forming part of the upper surface of the substrate chuck; and a plurality of recesses including a first recess and a second recess that are separated by the ring bank, wherein the substrate holding mechanism includes a pressure controller configured to control suction forces applied to the substrate by the plurality of recesses so that part of the substrate deforms to a convex shape toward the mold, and wherein the pressure controller controls the suction forces so that a deformation amount of the part of the substrate does not exceed a target deformation amount due to the plurality of through holes and a gap formed between the back surface of the substrate and the upper surfaces of the plurality of separation banks by the deformation of the part of the substrate in the separating process.

* * * * *